United States Patent [19]

Okano et al.

[11] 4,178,396
[45] Dec. 11, 1979

[54] METHOD OF FORMING AN INSULATING FILM

[75] Inventors: Haruo Okano; Nozomu Harada; Nobuhisa Kubota, all of Yokohama, Japan

[73] Assignee: Tokyo Shibaura Denki Kabushiki Kaisha, Kawasaki, Japan

[21] Appl. No.: 933,844

[22] Filed: Aug. 15, 1978

[30] Foreign Application Priority Data

Aug. 30, 1977 [JP] Japan .................................. 52-103192

[51] Int. Cl.² .................... H01L 21/312; C03C 15/00; C03C 25/06
[52] U.S. Cl. ........................................ 427/93; 156/657; 156/662; 357/24; 357/53; 427/87
[58] Field of Search .............................. 427/86, 88–91, 427/87, 93, 95, 399; 29/580, 571, 591; 357/23, 41, 47, 49, 53, 24; 148/186; 156/657, 659, 662, 648; 96/36.2, 38.4

[56] References Cited

U.S. PATENT DOCUMENTS

| 3,911,168 | 10/1975 | Schinella | 427/93 |
| 4,084,986 | 4/1978 | Aoki et al. | 427/93 X |

OTHER PUBLICATIONS

Applied Physics Letters, vol. 27, No. 9, 11-1-75, Interface Effects and High Conductivity in Oxides Grown from Polycrystalline Silicon, by D. J. DiMaria, pp. 505–507.
Journal of Applied Physics, vol. 48, No. 11, Nov. 1977, Evidence for Surface Asperity Mechanism of Conductivity in Oxide Grown on Polycrystalline Silicon, by R. M. Anderson et al., pp. 4834–4836.

Primary Examiner—William A. Powell
Attorney, Agent, or Firm—Oblon, Fisher, Spivak, McClelland & Maier

[57] ABSTRACT

A method of forming an insulating film of high breakdown voltage on a polycrystalline substance layer which comprises the steps of preparing the polycrystalline substance layer; selectively removing the polycrystalline substance layer; heat-treating for the first time that portion of the polycrystalline substance layer which is left after said selective removal in an oxidizing atmosphere to provide an oxide layer; removing the whole of said oxide layer; and heat-treating for the second time in an oxidizing atmosphere the polycrystalline substance layer which is now exposed due to removal of said oxide layer, thereby forming a second oxide layer acting as an insulating film on said exposed surface.

8 Claims, 29 Drawing Figures

F I G. 3A
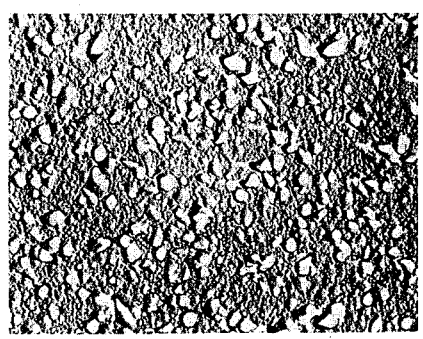
F I G. 3B
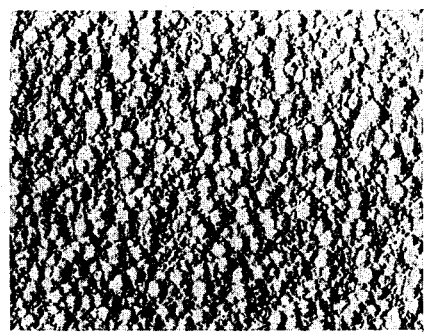
F I G. 3C
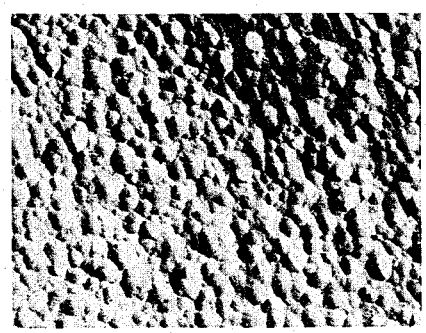

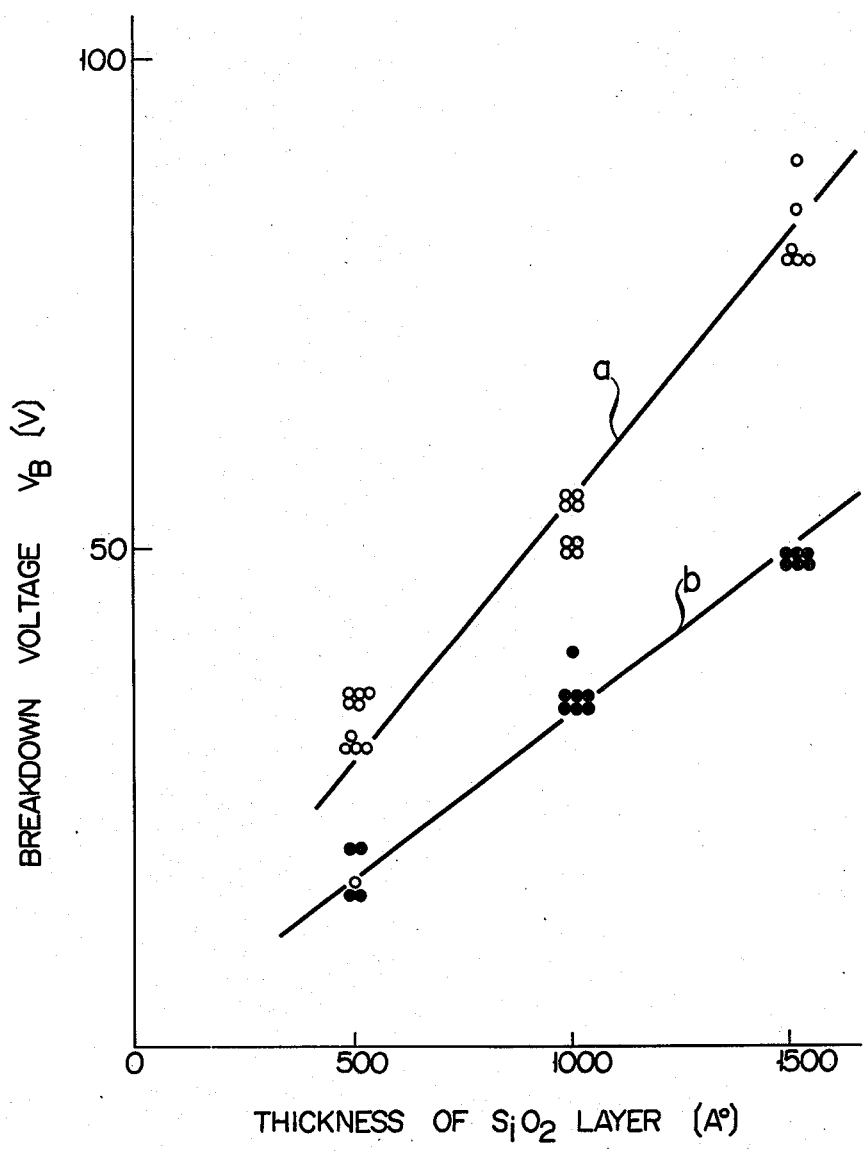

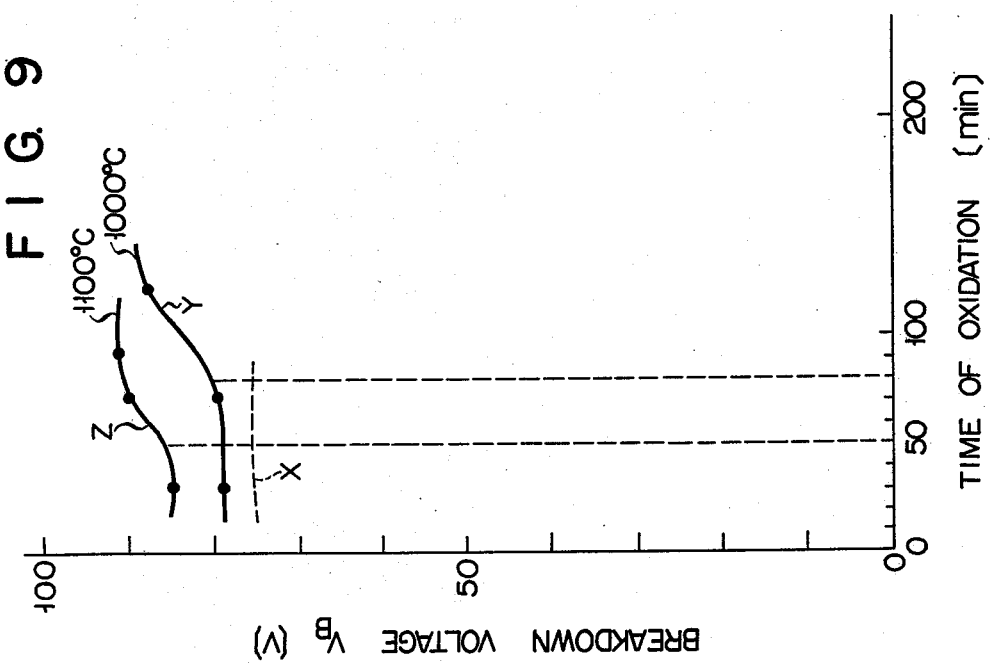
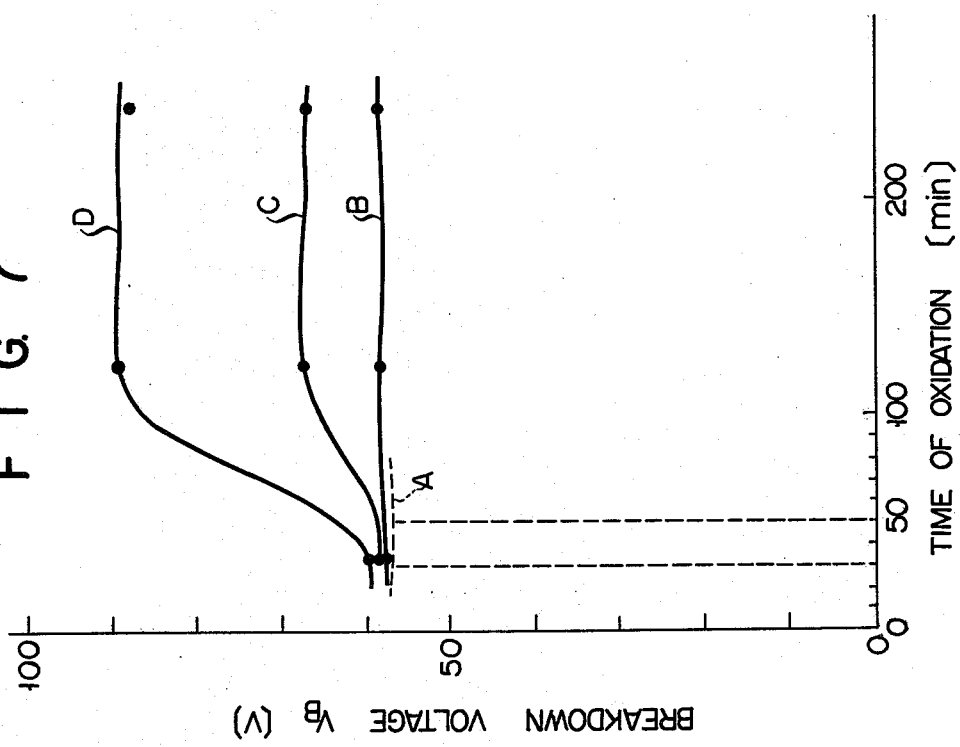

METHOD OF FORMING AN INSULATING FILM

BACKGROUND OF THE INVENTION

This invention relates to a method of forming an insulating film on a layer of a polycrystalline substance, and move particularly to a method of forming an insulating film of high breakdown voltage on said layer.

An insulating film formed on a polycrystalline substance layer is demanded to be substantially free from defects, such as pin holes and display a high insulating power with respect to a semiconductor device including multilayered polycrystalline silicon electrodes such as a charge—coupled device (abbreviated as "CCD") of FIG. 1A in which two party overlapping charge—transfer electrodes consist of a group of 4a, 4b, 4c and another group of 5a, 5b, 5c and are all made of polycrystalline silicon or an avalanche injection MOS memory comprising a double layer conducter consisting of a floating gate 8 and control 10 as shown in FIG. 1B. There will now be further detailed the semiconductor devices of FIGS. 1A and 1B. As shown in FIG. 1A, first gate oxide layers 2a, 2b and 2c and second gate oxide layers 3a and 3b are provided on a substrate 1 of P-type single crystal silicon. First polycrystalline silicon electrodes 4a, 4b and 4c each doped with impurity are formed on the first gate oxide layers 2a, 2b and 2c. Second polycrystalline silicon layers 5a and 5b each doped with impurity are mounted on the second gate oxide layers 3a and 3b. The first polycrystalline silicon electrodes 4a, 4b and 4c and the second polycrystalline silicon electrodes 5a and 5b are electrically insulated by an oxide layer 6a, 6b and 6c inserted therebetween.

As shown in FIG. 1B, a first gate oxide layer 7 is formed on a P-type single crystal silicon substrate 1, with a first polycrystalline silicon electrode 8 of a floating gate further formed on the first gate oxide layer 7. A second polycrystalline silicon electrode 10 is formed on the first polycrystalline silicon electrode 8 with an oxide layer 9 inserted therebetween for electrical insulation. The second polycrystalline silicon electrode 10 serves as a control gate. These first and second polycrystalline silicon electrode are both doped with impurity. Diffusion layers 11a and 11b are formed in the surface of the substrate 1, being disposed on both lower sides of the first polycrystalline silicon electrode 8.

The customary method of manufacturing the above-mentioned type of semiconductor device comprises the steps of first forming a first polycrystalline silicon layer, for example, by the chemical vapor deposition (abbreviated as "CVD") process; diffusing phosphor in the polycrystalline silicon layer at a temperature of, for example, 1,000° C. to render said polycrystalline silicon layer conducting; oxidizing the surface of the polycrystalline silicon layer; and using the resultant oxide film as an insulating film between the first polycrystalline silicon layer and a second polycrystalline silicon layer being later formed.

There will now be further described by reference to FIGS. 2A to 2E the prior art method of manufacturing the CCD of FIG. 1A. Referring to FIG. 2A, a first gate oxide layer 14 is formed, for example, on a P-type silicon semiconductor substrate 13. A polycrystalline silicon layer 15 is mounted on the first gate oxide layer 14, for example, by the CVD procss. Phosphor is diffused in the polycrystalline silicon layer 15 at a temperature of, for example, 1,000° C. to render said layer 15 more conducting. Photoresist layers 16a, 16b, 16c are formed photolithographically on the polycrystalline silicon layer 15 now containing phosphor. The exposed portions of the polycrystalline silicon layer 15 are etching method with the photoresist layers 16a, 16b, 16c used as etching masks to provide first layer polycrystalline silicon electrodes 17a, 17b, 17c (FIG. 2B). After removal of the photoresist layers 16a, 16b, 16c, the first gate oxide layers 18a, 18b, 18c are etched off, as shown in FIG. 2C, for example, by an etchant of ammonium fluoride with the first layer polycrystalline silicon electrodes 17a, 17b, 17c used as etching masks. The exposed surface of the P-type silicon semiconductor substrate 13 is heat-treated at a temperature of, for example, 1,000° C. in an oxidizing atmosphere to provide second gate oxide layers 19a, 19b, 19c, (FIG. 2D). At this time, oxide layers 20a, 20b, 20c are also formed on the first layer polycrystalline silicon electrodes 17a, 17b, 17c. Second layer polycrystalline silicon electrodes 21a, 21b, 21c are mounted on the oxide layers 19a, 19b, 19c, 20a, 20b, 20c by the same process as that by which the first layer polycrystalline silicon electrodes 17a, 17b, 17c are formed (FIG. 2E).

According to the above-mentioned prior art process of manufacturing the CCD, insulation between a group of the first layer polycrystalline silicon electrodes 17a, 17b, 17c and another group of the second layer polycrystalline electrodes 21a, 21b, 21c is effected by the intervening oxide layers 20a, 20b, 20c. However, these insulating oxide layers 20a, 20b, 20c have so low breakdown voltage as to chiefly give rise to short-circuit between the first and second layer polycrystalline silicon electrodes. Following are the possible causes which lead to the above-mentioned low breakdown voltage of the insulating oxide layers 20a, 20b, 20c where the photoresist layers 16a, 16b, 16c are lithographically formed under an unsatisfactory condition before providing the polycrystalline silicon electrode 17a, 17b, 17c (FIG. 2B), then the pattern edges of the electrodes project or the subsequent etching of the polycrystalline silicon 15 often roughens the exposed surfaces or edges of the electrodes 17a, 17b, 17c. An electric field tends to be concentrated at the projecting pattern edges or the roughened exposed surfaces and edges of the electrodes 17a, 17b, 17c. Consequently, the insulating oxide layers 20a, 20b, 20c are suppose to decrease in breakdown voltage. Further where, white turbidity appears in part or the whole of the polycrystalline silicon electrodes 17a, 17b, 17c then the breakdown voltage of the insulating oxide layers 20a, 20b, 20c often noticeably falls. The reason is assumed to be that the while turbid portions of the polycrystalline silicon electrodes 17a, 17b, 17c are formed of larger crystal particles than those which do not indicate such aspect; the surfaces of the electrodes often protrude; and consequently an electric field is concentrated at the white furbid portions of the electrodes. For illustration, FIG. 3A shows the 5,000 times magnified electronic microscope replica photograph of the white turbid region of the surface of a polycrystalline silicon electrode having a thickness of 5,000 Å. Therefore, formation of an insulating oxide film by the prior art process on the polycrystalline silicon electrodes 17a, 17b, 17c having the above-mentioned defects little elevates the breakdown voltage of said insulating oxide film. Where the first gate oxide layers 18a, 18b, 18c are etched with the first layer polycrystalline silicon electrodes 17a, 17b, 17c used as etching masks, those portions of said oxide layers which lie right below the edges of the electrodes are obliquely hollowed out by etching, causing the edges of the electrodes to take an overhanging form. Where, therefore, the second gate oxide layers 19a, 19b, 19c of FIG. 2D are formed, those portions of said oxide layers which lie near the edges of the polycrystalline silicon electrodes 17a, 17b, 17c are sharply scooped out. While being formed, the second layer polycrystalline silicon electrodes 21a, 21b, 21c are partly carried into said scooped regions, thereby often resulting in insufficient insulation between both groups of polycrystalline silicon electrodes 17a, 17b, 17c and 21a, 21b, 21c. Since, as previously described, the edges of the first layer polycrystalline silicon electrodes 17a, 17b, 17c take an overhanging form, a decline undesirably occurs in beakdown voltage between said electrodes and the silicon substrate 13.

To avoid the above-mentioned disadvantages, it may be considered to provide thick insulating oxide layers 20a, 20b, 20c. As seen from the previously described process of manufacturing the CCD, the formation of the thick insulating oxide layers 20a, 20b, 20c gives rise to an unbalance between the thickness of the oxide layers underlying the first layer polycrystalline silicon electrodes 17a, 17b, 17c and that of the oxide layers underlying the second layer polycrystalline silicon electrodes 21a, 21b, 21c, presenting difficulties in operating the CCD. Further, the first layer polycrystalline silicon layer 15, if made thin, will be wholly oxidized during the formation of an insulating oxide film, giving rise to the drawbacks that short-circuiting will take place between said first polycrystalline silicon layer 15 and the silicon semiconductor substrate 13, and consequently said polycrystalline silicon layer 15 will conversely have to be made unduly thick.

SUMMARY OF THE INVENTION

It is accordingly the object of this invention to provide a method of forming an insulating film of extermely high breakdown voltage on a polycrystalline substance layer. According to the invention, there is provided a method of forming an insulating film on a polycrystalline substance layer which comprises the steps of preparing a polycrystalline substance layer; selectively removing the polycrystalline substance layer; heat-treating for the first time that portion of the polycrystalline substance layer which is left after said selective removal in an oxidizing atmosphere to provide an oxide layer; removing the whole of said oxide layer; and heat-treating for the second time in an oxidizing atmosphere the polycrystalline substance layer which is how exposed due to removal of said oxide layer, thereby forming a second oxide layer acting as an insulating film on said exposed surface.

BRIEF DESCRIPTION OF THE DRAWING

FIGS. 3A to 3G are 5,000 times magnified electronic microscope replica photographs of the surface of various polycrystalline silicon layers and the surface of the oxide layers formed thereon;

FIG. 5 graphically sets forth the relationship between the thickness and breakdown voltage of an insulating film of $SiO_2$;

FIG. 7 graphically shows the relationship between the oxidation time of the first heat treatment and the breakdown voltage of the insulating film manufactured by the method of the invention where the polycrystalline silicon layer has a thickness of 1 micron;

FIG. 9 graphically indicates the relationship between the oxidation time of the first heat treatment and the breakdown voltage of the insulating film, where the polycrystalline silicon layer included therein has a thickness of 0.4 micron.

DESCRIPTION OF THE PREFERRED EMBODIMENTS

Figure 3D:
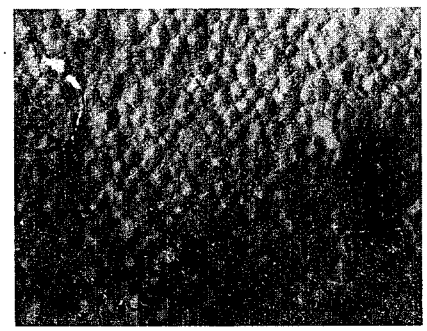
Figure 3E:
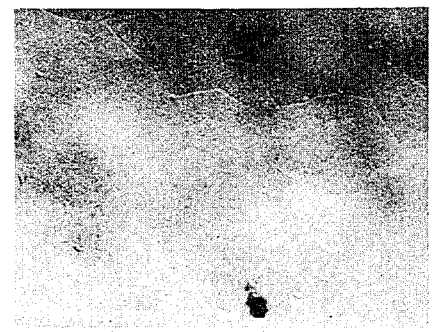

The method of this invention is based on the discovery that where an oxide layer formed by heat-treatment of a patterned polycrystalline substance layer in an oxidizing atmosphere is first removed, and thereafter another oxide layer is formed by similar heat-treatment of the patterned polycrystalline substance layer in an oxidizing atmosphere, then the latter oxide layer has for higher breakdown voltage than an oxide layer prepared by the prior art process without removing the preceding oxide layer as is the case with this invention. FIGS. 3B to 3F show the different surface conditions of, for example, a polycrystalline silicon layer which vary with the successive steps of manufacturing the CCD. FIG. 3B in an electronic microscope replica photograph of the surface of a polycrystalline silicon layer formed by the CVD process but not heat-treated. As is well known, polycrystalline silicon is an agglomeration of the extremely fine crystal grains. Numerous lattice defects appear particularly in the grain boundaries. FIG. 3C is an electronic microscope replica photograph of the surface of a polycrystalline silicon layer in which phosphor was diffused 10 minutes at a temperature of 1,000° C. As seen from FIG. 3C, the crystal grains of the polycrystalline silicon layer are grown big due to recrystallization. Yet, surface irregularities are still present. FIG. 3D is a similar photograph of the surface of an oxide layer formed on a polycrystalline silicon layer heattreated 60 minutes at a temperature of 1,100° C. in an oxidizing atmosphere. The surface of the oxide layer of FIG. 3D characteristically retains substantially the same surface condition as the polycrystalline silicon layer of FIG. 3C which was not oxidized. FIG. 3E is an electronic microscope replica photograph of the surface of a polycrystalline silicon layer, from which the oxide layer of FIG. 3D was removed by an etchant of, for example, ammonium fluoride. FIG. 3E shows that recrystallisation of crystal gains was promoted by heat treatment with the surface irregularities of the polycrystalline silicon layer prominently smoothed out by oxidation.

It can be inferred from comparison between the electronic microscope replica photographs of FIGS. 3D and 3E that high temperature treatment of the surface of an impurity, doped polycrystalline silicone layer in an oxidizing atmosphere oxidizes said surface to a certain depth; and the crystal grains of the polycrystalline silicon layer are recrystallised at the boundary between the resultant oxide layer and the polycrystalline silicon layer, leading to the growth of layer crystal grains, namely, the migration of crystal grains during the abovementioned oxidation. When certically observed, the oxide layer formed on the polycrystalline silicon layer is supposed to consist of oxide crystal grains whose size progressively increases according as recrystallization of said polycrystalline silicon crystal grains more proceeds at the boundary of the oxide layer and polycrystalline silicon layer during the successive steps of oxidation. Namely, it can be seen from the abovementioned comparison that the prior art press provides an oxide layer widely different from that which is formed on the ordinary single crystal silicon layer. Further, it is supposed that numerous lattice defects appear within the crystal grain boundary of a polycrystalline silicon layer which is partly converted into an oxide layer during the initial stage of high temperature treatment in an oxidizing atmosphere; and these lattice defects take place in a grown oxide layer, thereby rendering said oxide layer very defective. The oxide layer of FIG. 3D prepared by the prior art process has low breakdown voltage. Since, as is well known, the breakdown voltage depends on oxidation temperature and the thickness of an oxide layer produced, it is impossible to provide a thin oxide layer of high insulating power at a low oxidation temperature. The oxide layer of FIG. 3D is of the same type as the oxide layers 20a, 20b, 20c of FIGS. 2D, and 2E. These oxide layers have hitherto been used for insulation between the first layer polycrystalline silicon layer and the second layer polycrystalline silicon layer.

Figure 3F:
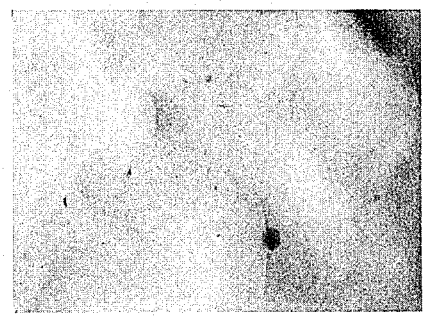

FIG. 3F is as electronic microscope replica photograph of the surface of an oxide layer formed again on the surface of the polycrystalline silicon layer of FIG. 3E from which the proceding oxide layer was removed, by applying the same process as that by which the oxide layer of FIG. 3D was grown. Unlike the oxide layer of FIG. 3D, the oxide layer of FIG. 3F has the surface irregularities substantially smoothed out. With the oxide layer of FIG. 3F, which was prepared by the second time high temperature treatment, no noticeable change appears in the size of the crystal grains.

Figure 3G:
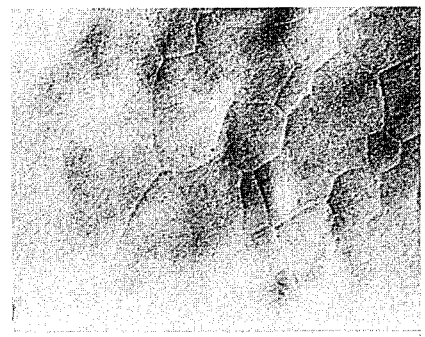

FIG. 3G is an electronic microscope replica photograph of the surface of a polycrystalline silicon layer, from which the oxide layer of FIG. 3F was removed. It is seen from FIGS. 3E and 3G that application of two high temperature heat treatments substantially eliminates prominant changes in the size of the polycrystalline silicon crystal grains.

The oxide layer of FIG. 3F having a thickness of 0.2 micron was found to have considerably higher breakdown voltage than the oxide layer of FIG. 3D prepared by the prior art process. The reason is supposed to be fact that the polycrystalline silicon layer on which the oxide layer of FIG. 3F was formed has the surface more smoothed out; the migration of the crystal grains was restricted; and a boundary between the oxide layer of FIG. 3F and the underlying polycrystalline silicon layer had a condition closely resembling that of the boundary between a single crystale silicon layer and an oxide layer formed thereon, thus elevating the breakdown voltage of the oxide layer of FIG. 3F.

This invention is based on the above-mentioned discovery. There will now be described by reference to FIGS. 4A to 4F a method according to one embodiment of this invention for manufacturing the CCD.

Figure 4A:
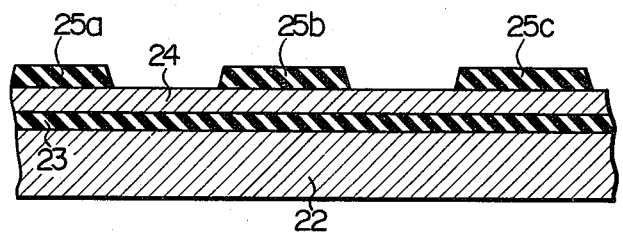
FIGS. 4A to 4F are sectional views of the CCD of FIG. 1A, showing the sequential steps of manufacturing the same by the method of this invention.
Figure 4B:
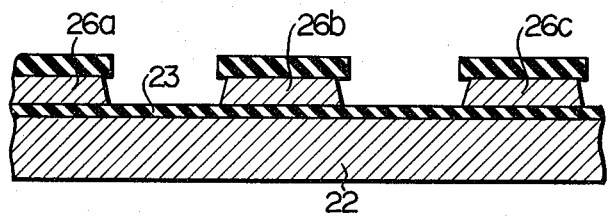
Figure 4C:
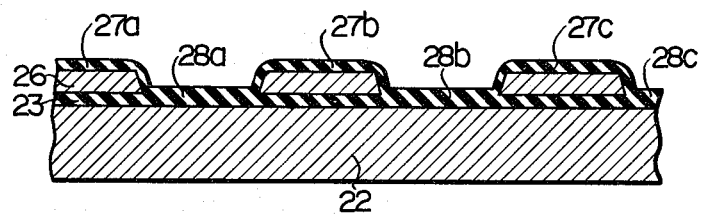
Figure 4D:
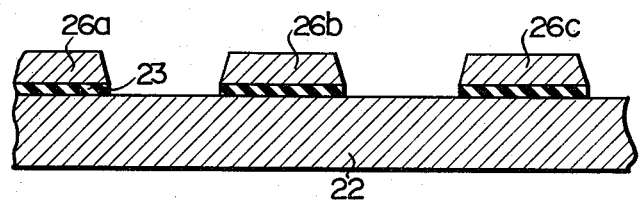
Figure 4E:
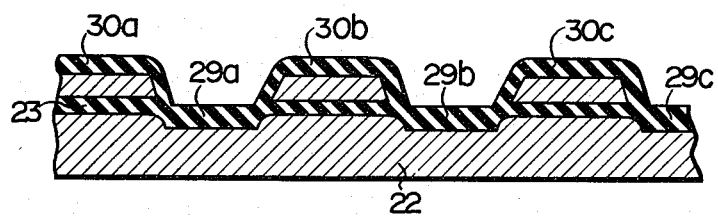
Figure 4F:
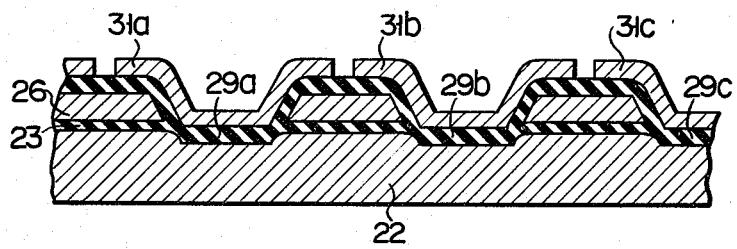

Referring to FIG. 4A, a first gate oxide layer 23 is mounted on, for example, a Ptype silicon semiconductor substrate 22. A polycrystalline silicon layer 24 is deposited on the first gate oxide layer 23, for example, by the CVD process. Phosphor is diffused as an impurity in the polycrystalline silicon layer 24 at a temperature of, for example, 1,000° C. to elevate the conductivity of said polycrystalline silicon layer 24. Photoresist films 25a, 25b, 25c are photolithographically formed on the polycrystalline silicon layer 24. This silicon layer 24 is etched by a dry etching process such as a plasma etching process with the photoresist films 25a, 25b, 25c used as etching masks, thereby providing first layer polycrystalline silicon electrodes 26a, 26b 26c. Those portions of the first layer polycrystalline silicon electrodes 26a, 26b, 26c which are now exposed due to the removal of the photoresist films 25a, 25b, 25c are heat treated 60 minutes for the first time at a temperature of, for example, 1,000° C. in an oxidizing atmosphere to form oxide layers 27a, 27b, 27c all over said exposed portions, as shown in FIG. 4c. In the step of FIG. 4D, first gate oxide layers 28a, 28b, 28c adjacent to the polycrystalline silicon electrodes 26a, 26b, 26c are etched off by an etchant of, for example, ammonium fluoride with said first layer polycrystalline silicon electrodes 26a, 26b, 26c used as etching masks. At this time, the oxide layers 27a, 27b, 27c formed on said first layer polycrystalline silicon electrodes 26a, 26b, 26c and also etched off by the ammonium fluoride etchant. When the etching of the first gate oxide layers 28a, 28b, 28c is brought to an end, the oxide layers 27a, 27b, 27c on the polycrystalline silicon electrodes 26a, 26b, 26c have to be completely etched off. To this end, said oxide layers 27a, 27b, 27c should have the same thickness as, or a smaller thickness than, the first gate oxide layers 28a, 28b, 28c. Later, heat treatment is carried out for the second time at a temperature of, for example, 1,000° C. to provide second gate oxide layers 29a, 29b, 29c as shown in FIG. 4E. At this time, oxide layers 30a, 30b 30c are also formed on the polycrystalline silicon electrodes 26a, 26b, 26c. These oxide layers 30a, 30b, 30c are nothing but those represented by the photograph of FIG. 3F. A second polycrystalline silicon layer is mounted on the second gate oxide layers 29a, 29b, 29c and oxide layers 30a, 30b 30c. Later, second layer polycrystalline silicon electrodes 31a, 31b, 31c are formed by the same process as that by which the first layer polycrystalline silicon electrodes 26a, 26b, 26c were formed, as illustrated in FIG. 4F.

With the CCD manufactured by the above-described method of this invention, the oxide layers 30a, 30b, 30c lying between the first layer polycrystalline silicon electrodes 26a, 26b, 26c and the second layer polycrystalline silicon electrodes 31a, 31b, 31c have extremely high breakdown voltage, thereby noticeably eliminating difficulties resulting from the occurrence of short-circuiting between the first layer polycrystalline silicon electrodes 26a, 26b, 26c and the second layer polycrystalline silicon electrodes 31a, 31b, 31c as well as between the first layer polycrystalline silicon electrodes 26a, 26b, 26c and the silicon semiconductor substrate 22. The above-mentioned advantageous effect of the method of this invention is apparent from FIG. 5, which graphically indicates comparison between changes in the breakdown voltage by the insulating oxide layers formed on the polycrystalline silicon layers by the method of this invention (line a) and changes in the breakdown voltage of the insulating oxide layers formed on the polycrystalline silicon layer by the prior art process (line b).

Figure 1A:
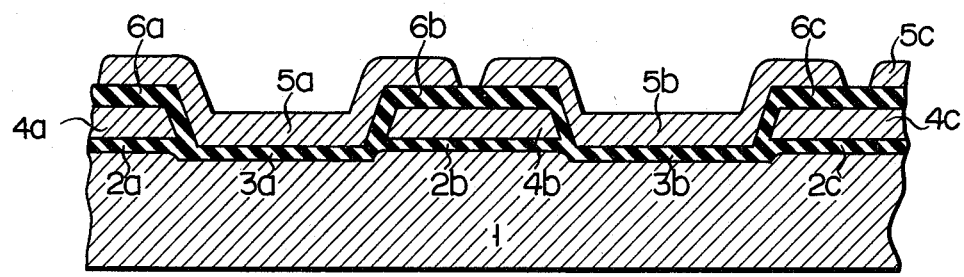
FIG. 1A is a sectional view of a charge-coupled device in which two overlapping charge-transfer electrodes are made of polycrystalline silicon.
Figure 1B:
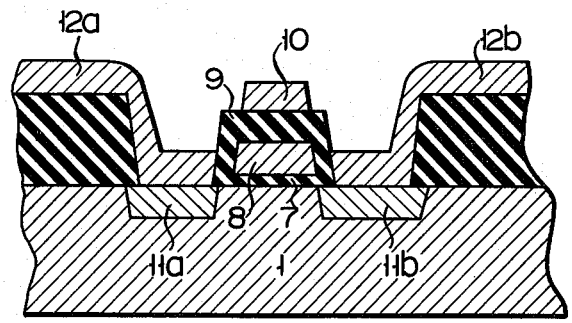
FIG. 1B is a sectional view of an avalanche injection MOS memory comprising a double layer conductor consisting of a floating gate 8 and control 10.
Figure 2A:
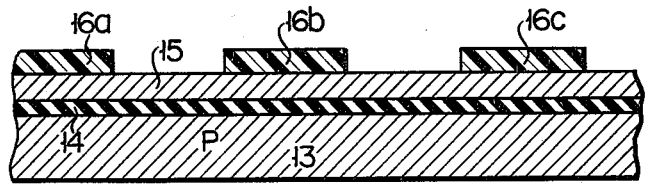
FIGS. 2A to 2E are sectional views of the CCD of FIG. 1A, showing the sequential steps of manufacturing the same by the prior art process.
Figure 2B:
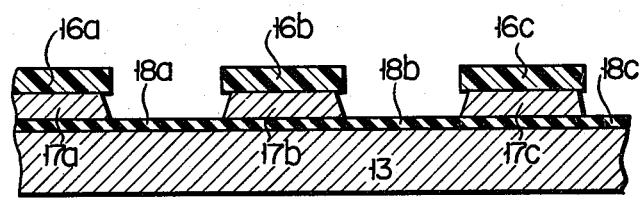
Figure 2C:
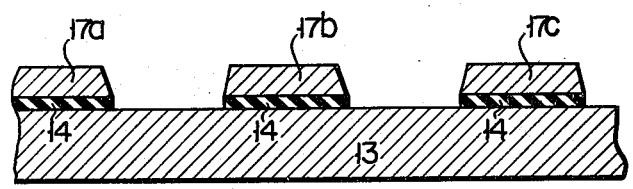
Figure 2D:
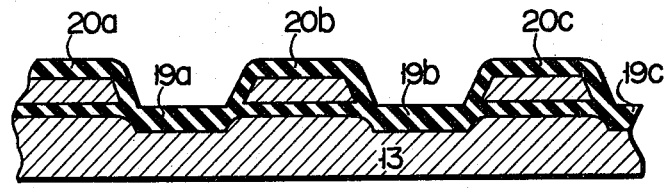
Figure 2E:
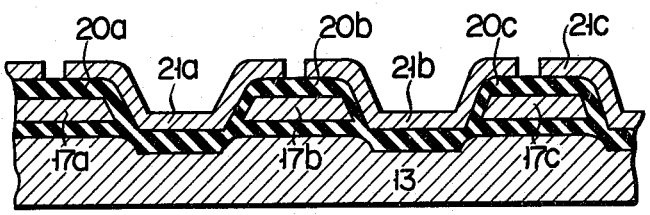

The merit of the method of this invention is supposed to result from the fact that not only the condition of the boundaries between the polycrystalline silicon layers and insulating oxide layers and the condition of the insulating oxide layers themselves are improved, but also projections and irregularities appearing on the edge portions or surfaces of the polycrystalline silicon electrodes manufactured by the prior art process as illustrated in FIG. 2B are smoothed out, thereby avoiding the concentrating an electric field in such defective regions.

Where oxide layers are again formed on a polycrystalline silicon layer after removal of the proceding oxide layers therefrom, the succeeding oxide layers are substantially free from the growth of such crystal grains of polycrystalline silicon as appeared during the formation of the preceding oxide layers, thereby practically suppressing the migration of said crystal grains. Accordingly, the polycrystalline silicon layer is oxidized in a manner closely resembling that in which a single crystal silicon layer is oxidized, thereby making it possible to form a thin oxide layer of high insulating power at a relatively low temperature. Further, the method of this invention has effectively suppressed a decline in the breakdown voltage of the insulating oxide layers which, for example, in the prior art CCD, accurred due to the sharp scooping of those portions of the insulating oxide layers which lay near the edge portions of the first layer polycrystalline silicon electrodes. Part of the polycrystalline silicon remaining in those gaps of the first layer polycrystalline silicon electrodes 26a, 26b, 26c which resulted from the irregular etching thereof can be eliminated during high temperature oxidation, thereby elevating insulation between the first layer polycrystalline silicon electrodes.

The method of this invention is not limited to what was described by reference to FIGS. 4A to 4F. For instance, the oxide layers 27a, 27b, 27c may be formed after etching off the first gate oxide layers 28a, 28b, 28c adjacent to the polycrystalline silicon layer 26a, 26b, 26c.

There will now be described by reference to FIGS. 6A to 6D a method according to another embodiment of this invention for manufacturing, for example, the CCD.

Figure 6A:
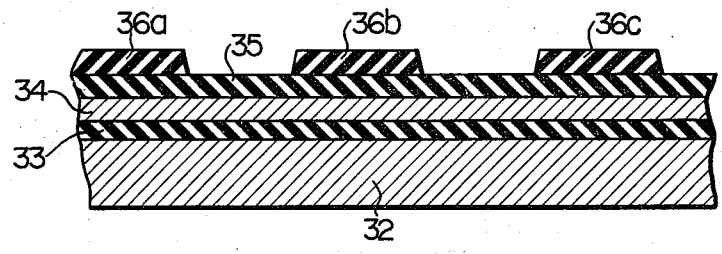
FIGS. 6A to 6D are sectional views of the CCD of FIG. 1A, showing some of the sequential steps of manufacturing the same by a modification of the method of the invention.
Figure 6B:
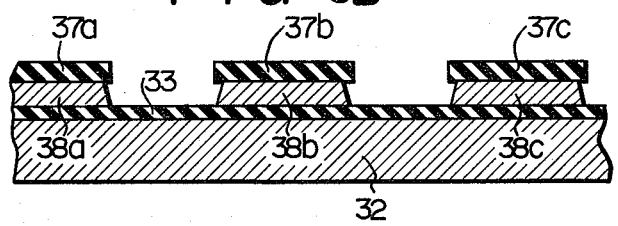
Figure 6C:
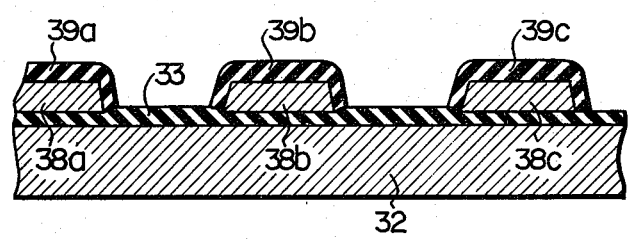
Figure 6D:
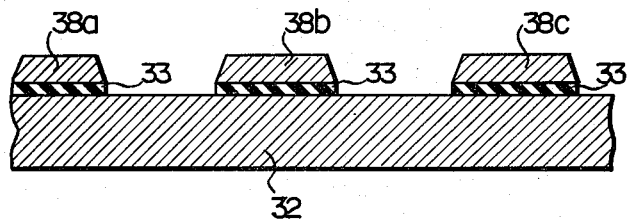

Referring to FIG. 6A, a first gate oxide layer 33 is first formed on for example, a P-type silicon semiconductor substrate 32. A polycrystalline silicon layer 34 is deposited on said first gate oxide layer 33, for example, by the CVD process. An impurity of phosphor is diffused in the polycrystalline silicon layer 34 at a temperature of, for example, 1,000° C. to elevate the conductivity of said polycrystalline silicon layer 34. Thereafter, this polycrystalline silicon layer 34 is heat-treated 60 minutes in an oxidizing atmosphere at a temperature of, for example, 1,100° C. to form an oxide layer 35 in said polycrystalline silicon layer 34. Photoresist films 36a, 36b, 36c are photolithographically formed on the oxide layer 35. The oxide layer 35 is etched off with the photoresist films 36a, 36b, 36c used a etching masks. The exposed portions of the polycrystalline silicon layer 34 is etched, for example, by means of plasma with oxide layers 37a, 37b, 37c used as etching masks, thereby providing first layer polycrystalline silicon electrodes 38a, 38b, 38c (FIG. 6B). That treatment is carried out at a temperature of, for example, 1,000° C. in an oxidizing atmosphere, thereby forming oxide layers 39a, 39b, 39c (FIG. 6C) on the exposed edge portions of the first layer polycrystalline silicon electrodes 38a, 38b, 38c. Those portions of the first gate oxide layer 33 which lie between the polycrystalline silicon electrodes 38a, 38b, 38c are etched off by an etchant of, for example, ammonium fluoride with said silicon electrodes 38a, 38b, 38c used as etching masks. At this time, the oxide layers 39a, 39b, 39c mounted on said silicon electrodes 38a, 38b, 38c are also etched off. When the etching of the first gate oxide layer 33 is brought to an end, the etching of the oxide layers 39a, 39b, 39c formed on the polycrystalline silicon electrodes 38a, 38b, 38c should also be finished. Later, the second time high temperature oxidization and the following steps are carried out in the same manner as that which was described by reference to FIGS. 4E and 4F. It is also possible to form the first layer polycrystalline silicon electrodes 38a, 38b, 38c in the step of FIG. 6B, etch those portion of the first gate oxide layer 33 which lie between the polycrystalline silicon electrodes 38a, 38b, 38c as shown in FIG. 4D, and form the oxide layers 39a, 39b, 39c on the exposed portions of the polycrystalline silicon electrodes 38a, 38b, 38c. The subsequent steps are carried out in the same manner as what was described by reference to FIGS. 4D, 4E and 4F.

The oxidizing atmosphere referred to in the foregoing description may be formed of not only a dry or wet oxygen gas, but also a gaseous mixture of oxygen and, for example, hydrochloric acid. Yet the same effect is ensured in all these case.

The foregoing description refers to the case where an insulating oxide layer was formed on a polycrystalline silicon layer in which an impurity was diffused. However, the method of this invention is also applicable to the case where an insulating film is formed on a layer of polycrystalline material prepared by heat-treating an amorphous material in an oxidizing or non oxidizing atmosphere. For instance, the method of the invention can also be applied in forming an insulating film on a layer of metal silicide, for example, $MoSi_2$ prepared by sputtering with $MoSi_2$ used as a target material, or a $MoSi_2$ layer prepared by simultaneous deposition of molybdenum and polycrystalline silicon or a $MoSi_2$ layer obtained by heat-treating a laminate of a polycrystalline silicon layer and a molybdenum layer in vacuum. In all the above-mentioned cases, the $MoSi_2$ layer is heat-treated in an oxidizing atmosphere to form an oxide film. After removing this oxide film, the $MoSi_2$ layer is again heat-treated in an oxidizing atmosphere to provide an insulating oxide film.

With the method of this invention oxidizing a polycrystalline silicon layer twice, it has been disclosed that satisfactory results are ensured when the first oxidizing step is carried out under certain conditions of temperature and time. There will now be described the requisite conditions of temperature and time for the first oxidizing step.

With the first oxidizing step, higher temperature is more effective. The temperature of oxidization is normally chosen to be at least 1,000° C. or preferably at least 1,100° C. The time of heat treatment is generally chosen to be at least 30 minutes or preferably at least 50 minutes, or more preferably at least 80 minutes. FIG. 7 indicates the relationship between the lengths of time of oxidation (abscissa) with the temperature levels of the first oxidizing step set at 1,000° C. (curve B), 1,100° C. (curve C) and 1,150° C. (curve D) and the breakdown voltage (ordinate) of an oxide layer prepared by the second oxidizing step after removal of the preceding oxide layer. A broken line A given in FIG. 7 denotes the insulating power of an oxide layer prepared by the prior art process. FIG. 7 shows that on insulating oxide layer obtained by the method of this invention has higher breakdown voltage than the prior art insulating oxide layer; and, with the method by the invention, higher temperature of oxidation ensures more elevated breakdown voltage. Where the first oxidizing step is carried out 120 minutes at a temperature of, for example, 1,150° C., then the resultant insulating oxide film has breakdown voltage about 1.5 times higher than that of the prior art. Such high breakdown voltage approximates that of an insulating oxide film formed on a single crystal silicon layer.

Figure 8A:
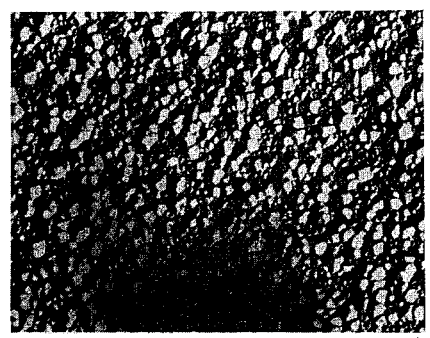
FIGS. 8A and 8B an electronic microscope replica photographs showing the different surface conditions of a polycrystalline silicon layer which vary with the level of temperature used in the first heat treatment.
Figure 8B:

FIGS. 8A and 8B an 5,000 times magnified electronic microscope replica photographs of the surface of a polycrystalline silicon layer from which an oxide layer formed by the first oxidizing step was removed, for example, by an etchant of ammonium fluoride. FIG. 8A represents the case where the first oxidizing step was carried out 120 minutes at a temperature of 1,000° C., and FIG. 8B denotes the case where said first oxidizing step was conducted 120 minutes at a temperature of 1,150° C. In both cases, a polycrystalline silicon layer on which an insulating oxide layer was formed was 1 micron thick. As apparent from these photographs, where the polycrystalline silicon layer was oxidized at a temperature of 1,150° C., then the crystal grains thereof grew considerably big due to the progress of crystallization, substantially eliminating the surface irregularities of said polycrystalline silicon layer.

FIG. 9 sets forth the breakdown voltage of an insulating oxide layer 0.125 micron thick formed on a first polycrystalline silicon layer 0.4 micron thick by the second heat treatment carried out at a temperature of 1,000° C. The curve X shows the breakdown voltage of the prior art insulating oxide layer. The curve Y denotes the breakdown voltage of an insulating oxide film according to the method of this invention when the first oxidizing step was carried out at a temperature of 1,000° C. The curve Z represents the breakdown voltage of the insulating oxide film of the invention when the first oxidizing step was conducted at a temperature of 1,100° C. As seen from these accurres, where the first polycrystalline silicon layer was as thin as 0.4 micron, the resultant insulating oxide film had prominently high breakdown voltage even when the first oxidizing step was undertaken at as low a temperature as 1,000° C. With the method of this invention, it will well serve the purpose, if the first oxidizing step is carried out a temperature of 1,000° C. or over, in case the polycrystalline silicon layer has a smaller thickness than 0.5 micron. Where, however, the polycrystalline silicon layer has a thickness of 0.5 micron or over, then the first oxidizing step should be taken at a higher temperature than at least 1,100° C. The reason is supposed to be that where the polycrystalline silicon layer has a smaller thickness, then the growth of the crystal grains of the polycrystalline layer and the migration of said crystal grains during the first oxidizing step can be easily ensured even when heat treatment is undertaken at a lower temperature. p The foregoing description refers to the case when the method of this invention was applied to the CCD in which the charge transfer electrode consisted of two mutually overlapping polycrystalline silicon layers. However, the method of the invention is also applicable to the CCD in which the charge transfer electrode is formed of those mutually overlapping polycrystalline silicon layers. The method of the invention can further be used in manufacturing, for example, an IC device of multilayer construction in which an insulating oxide film in mounted on a polycrystalline silicon conductive layer. Obviously, the method of the invention is adapted to manufacture a semiconductor device in which an insulating oxide film is interposed between a plurality of mutually overlapping substances.

What we claim is:

1. A method of forming an insulating film on a polycrystalline substance layer which comprises the steps of preparing the polycrystalline substance layer; selectively removing the polycrystalline substance layer; heat-treating for the first time those portions of the polycrystalline substance layer which are left after said selective removal in an oxidizing atmosphere to provide an oxide layer; removing said oxide layer; and heat-treating for the second time the surface of the polycrystalline substance layer from which the preceding oxide layer was removed in an oxidizing atmosphere to form an insulating oxide film.

2. The method according to claim 1, wherein the polycrystalline substance layer is prepared by heat-treating an amorphous substance layer in an oxidizing or nonoxidizing atmosphere.

3. The method according to claim 1 or 2, wherein the polycrystalline substance layer is doped with an impurity.

4. The method according to claim 1 or 2, wherein the polycrystalline substance layer is a polycrystalline silicon layer.

5. The method according to claim 1, wherein the polycrystalline substance layer is formed of metal silicide.

6. The method according to claim 1, wherein a polycrystalline substance layer having a smaller thickness than 0.5 micron is heat-treated for the first time at a temperature of 1,000° C. or over and for 30 minutes or longer.

7. The method according to claim 6, wherein the first heat treatment is carried out 80 minutes or longer.

8. The method according to claim 1, wherein the first heat treatment is conducted at a higher temperature than at least 1,100° C. and 50 minutes or longer.

* * * * *